United States Patent
Hoelscher et al.

(10) Patent No.: US 11,035,921 B2
(45) Date of Patent: Jun. 15, 2021

(54) METHOD AND SYSTEM FOR OPERATING A MAGNETIC RESONANCE FACILITY

(71) Applicant: Siemens Healthcare GmbH, Erlangen (DE)

(72) Inventors: Uvo Hoelscher, Erlangen (DE); Michael Koehler, Nuremberg (DE); Daniel Niederloehner, Erlangen (DE); Alto Stemmer, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/553,660

(22) Filed: Aug. 28, 2019

(65) Prior Publication Data
US 2020/0072934 A1 Mar. 5, 2020

(30) Foreign Application Priority Data
Aug. 28, 2018 (EP) .................................... 18191075

(51) Int. Cl.
*G01R 33/565* (2006.01)
*G01R 33/54* (2006.01)
(Continued)

(52) U.S. Cl.
CPC ..... *G01R 33/56518* (2013.01); *G01R 33/543* (2013.01); *G01R 33/5616* (2013.01); *G01R 33/56341* (2013.01); *G01R 33/58* (2013.01)

(58) Field of Classification Search
CPC ............ G01R 33/56518; G01R 33/543; G01R 33/5616; G01R 33/56341; G01R 33/58
See application file for complete search history.

(56) References Cited

U.S. PATENT DOCUMENTS

2008/0238421 A1* 10/2008 Kitane .................. G01R 33/56
324/307
2010/0148774 A1 6/2010 Kamata
(Continued)

OTHER PUBLICATIONS

Franz Schmitt: "The Gradient System"; Proceedings of the International Society for Magnetic Resonance in Medicine; ISMRM, 21st Annual Meeting and Exhibition; Salt Lake City, Utah, USA; pp. 1-13; Apr. 7, 2013; XP040632498.
(Continued)

*Primary Examiner* — Gregory H Curran
(74) *Attorney, Agent, or Firm* — Schiff Hardin LLP (57) ABSTRACT

In a method for operating a magnetic resonance (MR) facility during recording of MR data by using a MR sequence including a saturation module for a spin type to be saturated, in which a high-frequency saturation pulse is emitted between first and second spoiler gradient pulses, and multiple further gradient pulses apart from the spoiler gradient pulses, eddy current data is determined. The eddy current data describes eddy currents existing during emission of the saturation pulse and resulting from the further gradient pulses. Further, a pulse parameter of the first spoiler gradient pulse is selected based on the eddy current data such that the eddy currents generated by the first spoiler gradient pulse compensate for at least part of the eddy currents described by the eddy current data during emission of the saturation pulse. The facility is controlled to emit the first spoiler gradient pulse with the selected pulse parameter.

20 Claims, 6 Drawing Sheets

(51) Int. Cl.
    *G01R 33/563*     (2006.01)
    *G01R 33/561*     (2006.01)
    *G01R 33/58*     (2006.01)

(56) References Cited

U.S. PATENT DOCUMENTS

| | | | |
|---|---|---|---|
| 2010/0164496 A1* | 7/2010 | Briggs | G01R 33/56366 324/309 |
| 2015/0204959 A1* | 7/2015 | Grodzki | G01R 33/543 324/314 |

OTHER PUBLICATIONS

European Search Report dated Feb. 25, 2019, for Application No. 18191075.3.

\* cited by examiner

METHOD AND SYSTEM FOR OPERATING A MAGNETIC RESONANCE FACILITY

CROSS REFERENCE TO RELATED APPLICATIONS

This patent application claims priority to European Patent Application No. 18191075.3, filed Aug. 28, 2018, which is incorporated herein by reference in its entirety.

BACKGROUND

Field

The disclosure relates to a method for operating a magnetic resonance facility during recording of magnetic resonance data by using a magnetic resonance sequence, which includes at least one saturation module for a spin type to be saturated, in which a high-frequency saturation pulse is emitted between a first and a second spoiler gradient pulse, and multiple further gradient pulses apart from the spoiler gradient pulses. The disclosure also relates to a magnetic resonance facility, a computer program product, and an electronically readable data carrier/medium.

Related Art

Magnetic resonance facilities have now become an established imaging method, in particular in the medical field. One of the problems affecting image quality in magnetic resonance imaging includes eddy currents occurring while magnetic resonance sequences performed. Eddy currents are created when a magnetic field changes over time, that is to say, for example, when a gradient is switched on or off. This change over time in the magnetic field induces a current in a conductive structure of a component of the magnetic resonance facility. For their part the induced eddy currents themselves generate a magnetic field, specifically an eddy current field, which is overlaid by the existing magnetic fields. Since magnetic resonance imaging measures small effects and is therefore greatly dependent on good control over the existing magnetic fields, for example in terms of the homogeneity of the basic magnetic field and the linearity of the gradient fields, any additional magnetic fields occurring, that is to say eddy current fields too, are a problem for image quality. According to the geometry of the changing magnetic fields and conductive structures, the eddy current fields can have different spatial distributions.

Eddy currents usually die away with an exponential function. In this regard, the time constant of eddy current decay is determined by the material properties of the conductive structure, primarily its conductivity. If the eddy currents are induced in various conductive structures by various gradient fields, for example in the case of X, Y, and Z gradient coils, then a superposition of the individual eddy current fields is produced. The said resulting aggregate eddy current field can possess multiple time constants and have complex spatial distributions.

Two fundamental approaches exist to preventing or at least reducing the effects of eddy currents. On the one hand it is possible to wait until the eddy currents have died away, and on the other hand a magnetic field which generates opposite eddy currents can be switched in. Both these approaches are employed in numerous different forms in today's magnetic resonance facilities.

Various methods have already become known in magnetic resonance imaging for blanking out, and therefore saturating, the signals of certain spin types. In this regard use is made in particular of the fact that differently bound protons have slightly different resonance frequencies, which is also referred to as chemical shift. The type of saturation which is used the most relates to the spins of protons bound in fat as a spin type, in short so-called fat saturation. In this regard the aim is to suppress the magnetic resonance signals of fatty tissue in the human body. In this regard use is made of chemical shift, according to which spins in fat molecules have a slightly different resonance frequency from spins in water molecules. It is therefore possible to deploy high-frequency pulses which only affect the spins in fat molecules ("fat spins") and not the spins in water molecules ("water spins"). High-frequency pulses of this kind are also referred to as spectrally selective pulses.

An essential prerequisite for saturation methods of this kind is that the basic homogeneity of the basic magnetic field (B0 field) is distinctly better than the chemical shift between the resonance frequencies. Thus for water and fat, the frequency difference is approx. 210 Hertz at 1.5 Tesla, so that a B0 homogeneity which is distinctly better than 210 Hertz is needed for effective fat saturation. If this is not the case then, for example, water spins can possess the same resonance frequency as fat spins in a few places if the basic magnetic field is smaller. Then a spectrally selective excitation affects not just fat spins but also water spins. It is also conceivable incidentally, in the event of an increase in the basic magnetic field, that the spectrally selective pulses do not affect either fat spins or water spins.

Both these error situations, which occur due to inhomogeneities, are problematical for clinical imaging with fat saturation since signal from water spins can disappear and signal from fat spins can be maintained. Since corresponding inhomogeneities can also be created by eddy current fields, eddy currents are also relevant with reference to fat saturation. As a result of spatial variation in the eddy currents or the eddy current fields respectively, inhomogeneities mostly occur locally, for example at the edge of the measurement region. But local phenomena especially can be wrongly interpreted as pathologies since the fat saturation is fundamentally functioning and only fails in a few, locally limited regions.

Eddy currents and eddy current fields created as a result also play a major role in Echo Planar Imaging (EPI) sequences used as magnetic resonance sequences, where EPI stands for "Echo Planar Imaging". Of particular note in this respect is diffusion EPI imaging. Since strong gradient fields are switched rapidly by corresponding gradient pulses, EPI imaging is particularly susceptible to eddy currents. The effects of eddy currents in diffusion EPI imaging take many forms. Thus the outcome can be distortions of the magnetic resonance image being created, loss of magnetic resonance signals, and a deterioration in fat saturation. A further particular feature of the diffusion EPI sequence is that the eddy currents change greatly across the overall measurement. Other magnetic resonance sequences, such as for example TSE sequences (Turbo Spin Echo sequences) or GRE sequences (Gradient Echo sequences), play through relatively similar gradient pulses after each excitation of the spins, for example slice-selection gradient pulses and read-out gradient pulses, which remain the same since only the phase-coding gradient pulses change. In the case of a diffusion EPI sequence the gradient pulses for the image recording are admittedly also very similar but alternating diffusion gradient pulses are used. These diffusion gradient pulses vary extremely strongly in strength and direction of the gradient fields so that their eddy currents also vary particularly strongly during the measurement.

For diffusion EPI sequences, compensation methods in terms of eddy currents have already been proposed concentrating on aspects of the imaging, for example bipolar diffusion gradients, predistortion of gradient pulses, and recording of magnetic resonance images in post-processing.

In this regard saturation modules in the magnetic resonance sequence have not yet received further consideration up to now, in particular in terms of fat saturation in diffusion imaging. The reason is that diffusion imaging has mostly been applied in regard to applications in the patient's head region or neurological issues. Because in this context, small regions of investigation are usually employed in the center of the magnetic resonance facility, and therefore the homogeneity volume, in which the eddy current fields are still small enough so that homogeneity is not affected much. For the increasingly frequently employed whole-body imaging or torso imaging however, larger investigation regions have to be selected in which disturbances of the saturation methods due to eddy currents can also become relevant. Up to now a workaround solution has mostly been employed in regard to this, where saturation methods which do not make use of chemical shift are employed. An example of this is the STIR method (Short Tau Inversion Recovery), which is based on inversion pulses. However these saturation methods require a longer investigation time and have a higher SAR load (load resulting from absorbed energy from the high-frequency radiation) for the patient, which further extends the overall measurement time additionally where relevant since waiting intervals have to be inserted. Furthermore using STIR reduces the signal-to-noise ratio in general.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to reduce the influence on saturation quality of eddy currents for saturation methods using spectrally selective high-frequency saturation pulses.

In an exemplary embodiment, a saturation method includes: determining eddy current data, which describes eddy currents which exist during emission of the saturation pulse and are a result of the further gradient pulses, selecting at least one pulse parameter of the first spoiler gradient pulse based on the eddy current data to compensate for at least part of the eddy currents described by the eddy current data by eddy currents generated by way of the first spoiler gradient pulse at least during emission of the saturation pulse, and emitting the first spoiler gradient pulse with the at least one selected pulse parameter.

This makes it possible, even in the case of large recording areas, such as for example in whole-body imaging and/or torso imaging, to reduce the influence on saturation, in particular fat saturation in the case of spins of protons bound in fat as a spin type, of eddy current fields. In this regard use is made of the fact that the spectrally selective high-frequency-saturation pulses in the saturation module are deployed together with spoiler gradient pulses. The second spoiler gradient pulse following the spectrally selective saturation pulse dephases the spins of the spin type flipped into the transverse plane, in particular the fat spins. Additionally it is usual to emit, immediately prior to the saturation pulse, a spoiler gradient pulse which has at least in essence the negative moment to the spoiler gradient pulse following the saturation pulse. This first spoiler gradient pulse of the saturation module ensures in the case of rapid repetitions of the saturation module and therefore the saturation pulse that, at the start of the saturation pulse, the spins of the spin type to be saturated, in particular the fat spins, are rephased and therefore no residual spin type magnetization remains. Advantageously, exemplary aspects prevent stimulated echoes and/or rephased magnetization paths.

In an exemplary embodiment, the first spoiler gradient pulse emitted prior to the saturation pulse in at least one pulse parameter is matched to the currently present eddy currents of the magnetic resonance sequence such that the same are at least partly compensated for. In an exemplary embodiment, the at least one pulse parameter is selected from pulse parameters determining the pulse shape, the polarity, and the gradient directions used. As far as the pulse shape goes, it has been shown that the amplitude of the first spoiler gradient pulse is mainly relevant here as a pulse parameter, since in the present case eddy currents with a long time constant are being considered which are mainly influenced by the area under the pulse shape. In this regard other pulse parameters which can be adjusted are also conceivable however, for example the slew rate. In an exemplary embodiment, the amplitude is included as a pulse parameter since this mainly influences the integral over the pulse shape and therefore the area. A further degree of freedom employed particularly advantageously in the context of the present disclosure is the fact that the spoiler gradient pulses were presented on any desired gradient axis up to now, for example in the form of X gradients, Y gradients, or Z gradients, since their task is purely dephasing the spins of the spin type. It has also been proposed that the spoiler gradient pulses be output on all three gradient axes to spread the load on the gradient amplifiers (GPA). It is fundamentally irrelevant for the pure task of dephasing or respectively rephasing however, which direction is selected for the spoiler gradient pulses, in particular which of the three main directions (gradient axes) for which a gradient coil is present in the gradient coil arrangement this takes place on.

If the first spoiler gradient pulse is to be used to compensate for the eddy currents, it is therefore possible, with particular advantage, to vary the amplitude and the distribution to the gradient axes, and therefore the gradient direction, dynamically during the measurement, in each case as a function of the eddy currents generated by the preceding further gradient pulses. Because the slopes of the spoiler gradient pulses also generate eddy currents which can counteract the eddy currents generated by switching in the further gradient pulses in preceding modules. To this end therefore, at every time point when a saturation pulse is to be output, eddy current data is determined which describes the eddy currents of the previous gradient pulses. Practice shows that this relates primarily to the eddy currents of the previously measured slice or the previous repetition respectively, where in the case of eddy current time constants that are longer than the measurement duration for a slice, further gradient pulses of multiple earlier slices can also be relevant. In this regard use is made of the fact that the eddy current data can be determined very precisely because the gradient profiles are known in advance for the entire investigation, and therefore the entire measurement duration. In particular the strengths and time constants of the induced eddy currents can be determined in a once-only calibration step since they are not, or at least not in a relevant manner, dependent on the current patient, which will be examined in further detail below.

In an exemplary embodiment, if the eddy current data is available, pulse parameters of the first spoiler gradient pulse can be optimized, in particular the amplitude, the polarity, and the use of the gradient axes/main directions. In an exemplary embodiment, it is therefore possible to configure a spoiler gradient pulse to the effect that its eddy current fields are opposite to the existing eddy current fields.

In an exemplary embodiment, a spoiler gradient pulse used only for saturation up to now is then likewise used for compensating for eddy currents or eddy current fields respectively. It has been shown in this respect that the first spoiler gradient pulse can be modified such that it continues to fulfill its former purpose with minor losses but additionally also addresses the problem that saturation can fail in a few lower regions of the investigation region due to eddy currents. In this regard use can preferably be made of the fact that the selection of gradient axes on which the first spoiler gradient pulse is output, and amplitude, can be substantially varied within certain limits, while the original task of the first spoiler gradient pulse continues to be fulfilled.

This gives rise to distinct advantages compared to other measures, for example additional compensation gradients, bipolar diffusion schemes and/or wait intervals. The method proposed here needs no additional measurement time since the durations of the first spoiler gradient pulses are already a fixed constituent of the overall time period. In other words the echo time (TE) and the repetition time (TR) are not affected.

A further advantage is that since gradient pulses that are already present are being used for a second purpose, no or only a little additional power is needed for the gradient amplifiers or the overall gradient system respectively. This is particularly advantageous for diffusion EPI sequences since many measurement protocols with EPI diffusion sequences are limited by the electrical power of the gradient amplifiers or the cooling capability of the gradient coil arrangement and gradient amplifiers.

In this regard, in an exemplary embodiment, the method is applied particularly advantageously if the further gradient pulses include at least one diffusion gradient pulse in a diffusion module of the magnetic resonance sequence and/or the magnetic resonance sequence is an EPI sequence. Advantages arise in particular with diffusion EPI imaging therefore. Precisely in the case of diffusion gradients being used, the problem outlined in the introduction arises, namely that these vary substantially in strength and direction so that constantly different eddy currents are present in the saturation modules, to which the first spoiler gradient pulse can be dynamically adjusted from one saturation module to the next by using the present disclosure.

It is advantageous in this context in particular if as a pulse parameter, the polarity of the first spoiler gradient pulse of the saturation module following the diffusion module is selected opposite to that of the at least one diffusion gradient pulse. Since it was frequently the case up to now that the polarity of the first spoiler gradient pulse was selected the same as the polarity of the previous diffusion gradient pulses, it is therefore proposed to make selection of the polarity of the spoiler gradient pulse dependent on the polarity of the diffusion gradient pulses such that the opposite polarity to the diffusion gradient pulses is provided. In this regard it should also be noted at this point that the preceding diffusion module could mostly be the diffusion module of the previous slice recording or repetition respectively since saturation modules are mostly used at the start of a slice recording or repetition respectively.

In an exemplary embodiment, the eddy current data can be determined in the context of a simulation and/or by using a mathematical relation and/or by taking account of already known sequence data describing the further gradient pulses and/or at least one item of component information describing at least one property of at least one component of the magnetic resonance facility with reference to eddy currents induced by gradient pulses. It must be emphasized in this regard that the present disclosure is mainly aimed at a distinct reduction in the eddy current fields present during emission of the saturation pulse so that a complete compensation for all eddy currents or eddy current fields respectively is therefore not needed, and therefore it is sufficient to perform an estimation for the eddy current data. However an estimation of this kind, given knowledge of the magnetic resonance sequence used or in overall terms respectively the measurement protocol for the entire investigation, which usually contains multiple repetitions of the magnetic resonance sequence, and also of the eddy current causes, mapped here by the items of component information, which ultimately describe the conductive structures in which eddy currents can be induced, is readily possible on the basis of fundamental relations so that simple simulations and/or mathematical relations can be derived to determine the eddy current data in a labor-saving manner and therefore to estimate the eddy currents and eddy current fields.

With reference to the component information provision can be made with particular advantage for same to be determined in a calibration operation by measuring with predefined calibration gradient pulses. In this regard and also in the case of other, for example theory-based determinations of the component information, it is appropriate if the component information includes at least one strength variable describing the strength of induced eddy currents and/or at least one time constant describing the decay of the eddy currents, where the time constant represents the essential, critical variable. In an exemplary embodiment it is therefore conceivable to map pulse parameters onto resulting eddy currents and therefore eddy current fields. In this respect for example, targeted calibration operations can be carried out by emitting, in a calibration measurement, gradient pulses with defined pulse parameters on the various gradient axes, to each of which is assigned a gradient coil of the gradient coil arrangement, so that conclusions can be drawn about general dependences and therefore, given knowledge of the pulse parameters of the other gradient pulses used in the context of the investigation, the eddy current data can easily be determined.

The determination of the at least one pulse parameter can be effected in an optimization method aimed at minimizing residual eddy currents and/or on the basis of at least one mathematical relation and/or by using at least one boundary condition. In view of the idea, in particular, that a distinct qualitative reduction in the eddy currents and therefore eddy current fields should be the aim, and therefore not a precise extinction, a derived mathematical relation can also be sufficient in the context of determining the adjusted pulse parameters. It is naturally also conceivable however, to employ an optimization method in particular when further aspects that cannot be easily mapped in mathematical relations, are to be taken into account, in particular also certain boundary conditions.

In this context a particularly advantageous exemplary embodiment of the present disclosure provides for at least one minimum overall moment of the first spoiler gradient pulse and/or a maximum amplitude of the first spoiler gradient pulse, and/or a maximum slew rate of the first spoiler gradient pulse to be used as a boundary condition. In an exemplary embodiment, limitations given by the magnetic resonance facility or the measurement protocol in general, and by the gradient coil arrangement specifically, can be used during determination of the pulse parameters. Precisely in regard to the gradient system, in particular as far as the performance capability of the gradient amplifiers and/or the gradient coils of the gradient coil arrangement goes, there are mostly system-provided restrictions for pulse parameters, for example a maximum slew rate, a maximum gradient amplitude, or a general power restriction respectively. Maximum slew rates and/or maximum gradient amplitudes frequently refer in this regard to individual gradient axes. A minimum overall moment represents a further relevant boundary condition. A minimum overall moment is required for dephasing the spins of the spin type following the saturation pulse, that is to say by means of the second spoiler gradient pulse, the effect of which is of course intended to be compensated for by the first spoiler gradient pulse, in order to optimize the effect of the saturation pulse.

In this context it is also particularly advantageous if the most extensive possible rephasing of spins of the spin type to be saturated, that are dephased by the second spoiler gradient pulse of a preceding saturation module, is used as a further, in particular lower weighted optimization aim, and/or as a boundary condition. The leading spoiler gradient pulse of a saturation module is used for rephasing the dephasing second spoiler gradient pulse of the previous saturation module. Due to modifications of pulse parameters in regard to the eddy current data it may be the case that this rephasing is no longer complete. For many situations this will not significantly affect image quality, but there can be special cases where an additional boundary condition or an additional optimization aim respectively should be introduced appropriately in this respect to improve image quality overall.

It should be further noted at this point, with reference to determination of the at least one pulse parameter, that the component information already mentioned can naturally also be used here as well since the spoiler gradient pulses are of course also being emitted via the gradient coils of the gradient coil arrangement, and therefore the component information also applies with reference to the spoiler gradient pulses, and therefore the compensating eddy currents/eddy current fields can be determined in a simple manner.

In an exemplary embodiment, as a function of the pulse parameter selected for the first spoiler gradient pulse, at least one pulse parameter of the second spoiler gradient pulse of a preceding saturation module is also adjusted. For example if adjustment of the pulse parameters for the first spoiler gradient pulse results in a change to its overall moment, which is of course intended to have a rephasing effect, it can be appropriate to correspondingly adjust the preceding dephasing moment. In other words, in the event of a rephasing moment diverging from a specified moment due to the selected pulse parameter of the first spoiler gradient pulse, it is possible to provide for the pulse parameter of the second spoiler gradient pulse of the preceding saturation module to be adjusted to generate a dephasing moment corresponding to the rephasing moment. In this regard, as already mentioned, it must be ensured that a minimum dephasing moment is maintained in all cases so that the second spoiler gradient pulse can fulfill its purpose.

Investigations regarding the present disclosure have shown that even with simple, roughly estimating measures, a reduction in eddy currents and therefore eddy current fields to approx. half was possible at the time point of the saturation pulse without a deterioration occurring in other places regarding eddy currents, and therefore eddy current fields worsening noticeably elsewhere.

The disclosure also relates to a magnetic resonance facility, having a control facility realized for carrying out the inventive method. All explanations regarding the inventive method can be transposed analogously to the inventive magnetic resonance facility so that the advantages already mentioned can be obtained with this also. In this regard the magnetic resonance facility therefore has in particular a gradient coil arrangement which can have multiple gradient coils, which are each assigned to a main direction, that is to say gradient axis, for example an X gradient coil, a Y gradient coil, and a Z gradient coil. The control facility can include at least one processor and at least one memory. To implement the steps of the inventive method the control facility can have corresponding controllers, for example a determiner for determining the eddy current data, a selector for selecting the at least one pulse parameter, and a general sequencer which is realized for outputting the magnetic resonance sequence, that is to say in particular also the first spoiler gradient pulse with the at least one selected pulse parameter.

The disclosure also relates to a computer program product configured to be loaded direct into a memory of a memory facility of a magnetic resonance facility, and has a computer program configured to carry out the steps of a method according to one or more aspects described herein when the computer program is executed in the control facility of the magnetic resonance facility.

The computer program can be stored on an electronically/computer readable data carrier/medium, which therefore includes electronically readable control information stored on same. In this example, the items of control information includes at least one computer program, and is realized such that program carries out a method according to one or more aspects described herein when the data carrier is used in a control facility of a magnetic resonance facility. The data carrier can be, for example, a non-transient data carrier, for example a CD-ROM or other memory.

It should be noted once again at this point in the interest of clarity that the concept of the saturation module must be understood broadly in the sense that the pulses contained in same are used for saturation of the spin type, where relevant also by interaction with further pulses lying outside the saturation module. Thus for example two basically chemically selective saturation techniques are known for fat saturation: on the one hand a "genuine" fat saturation with a 90° saturation pulse and subsequent dephasing, and on the other hand an inversion (180°) affecting only fat spins, with the excitation of the other spin type (here water spins) occurring when the magnetization of the fat spins passes through zero. In the second case also, where the SPAIR technique represents an example, spoiler gradient pulses are employed to dephase all magnetization that was not exposed to a perfect 180° pulse. It is essential for the saturation module in the context of the present disclosure therefore that it includes a spectrally selective high-frequency pulse, the saturation pulse, and spoiler gradient pulses. Then the inventive procedure can always be applied.

The present disclosure is explained in further detail below on the basis of a diffusion EPI sequence as the magnetic resonance sequence. For fat saturation, use is made of a saturation module, which can also be a SPAR module (SPAIR—Spectral Attenuated Inversion Recovery).

Figure 1:
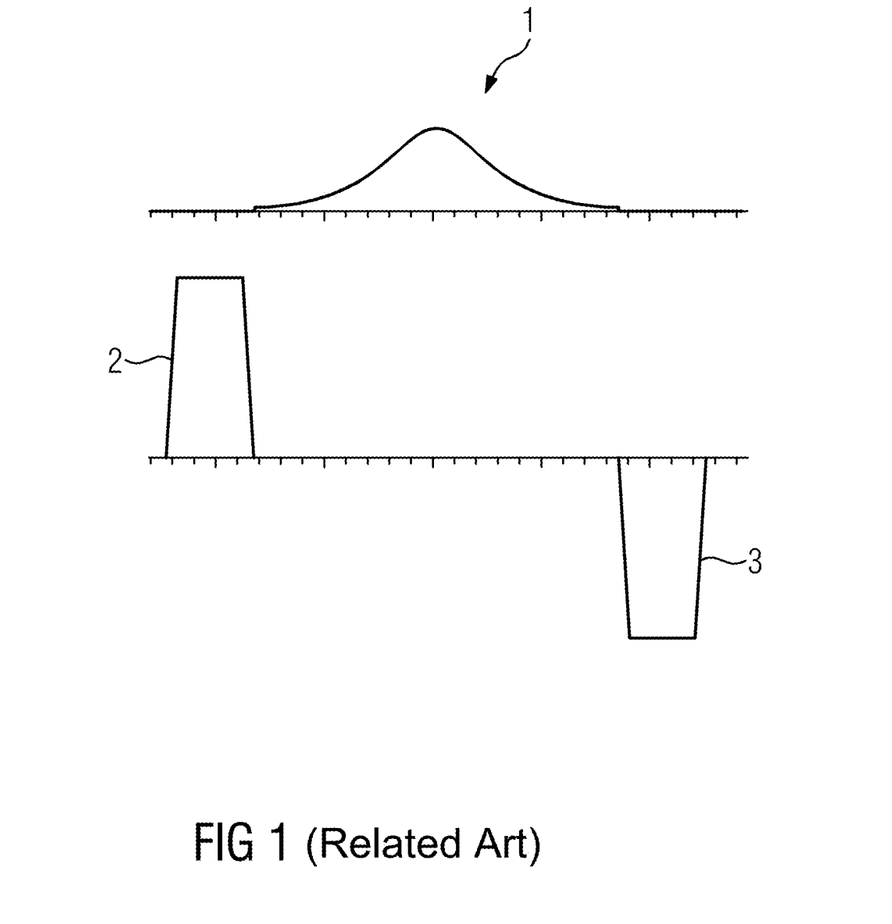
FIG. 1 illustrates an example process of a saturation module.

In this regard FIG. 1 shows the fundamental process of a saturation module of this kind. A spectrally selective high-frequency saturation pulse 1 is emitted in the time between two spoiler gradient pulses 2, 3. In this regard the spoiler gradient pulse 3 is used for dephasing the fat spins (or the other spin type to be saturated respectively) and the first spoiler gradient pulse 2 is used for rephasing, and consequently usually has the same moment as the second spoiler gradient pulse 3.

Figure 2:
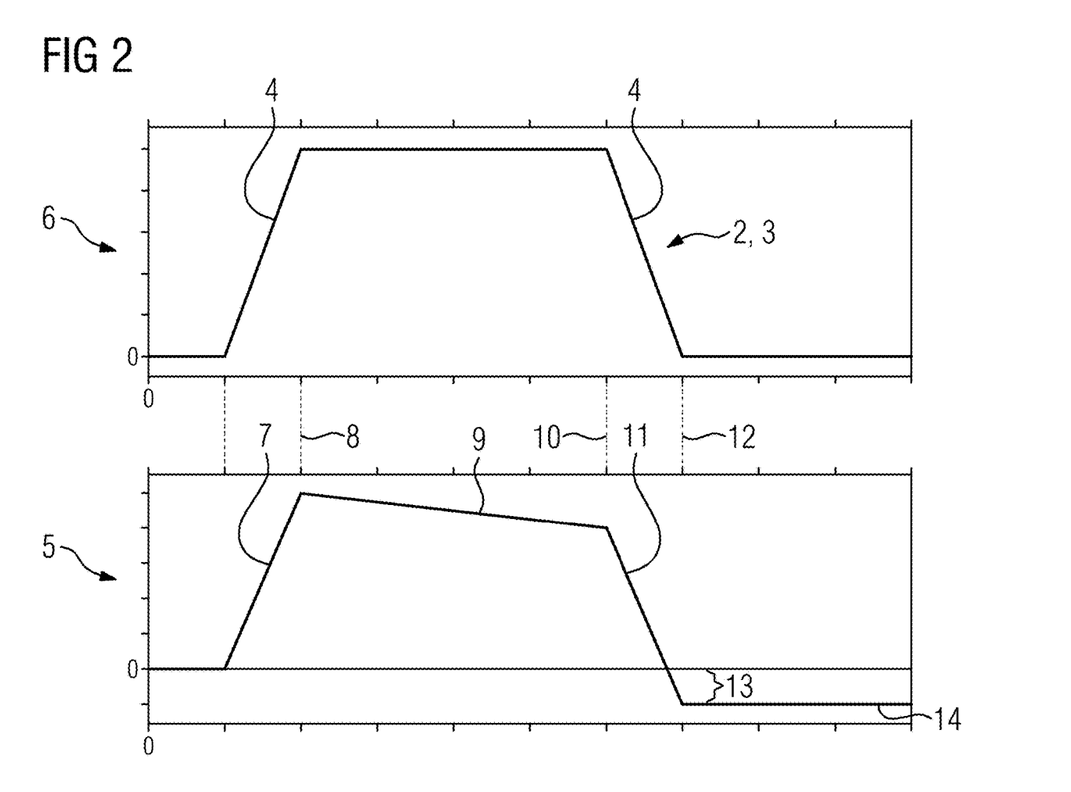
FIG. 2 illustrates a spoiler gradient pulse and the eddy current created as a result of the process illustrated in FIG. 1.

Fundamentally, gradient pulses generate eddy currents in conductive structures of components of the magnetic resonance facility, as will be explained by FIG. 2, using the example of a spoiler gradient pulse 2, 3, which represents any gradient pulse. By means of its slopes 4 a gradient pulse causes a change in the magnetic field so that an eddy current is induced in conductive structures as shown in the lower graph 5, which corresponds to the upper graph 6 in its time period. In the segment 7 an eddy current builds up by analogy with the slope 4. This starts to decline exponentially from the time point 8, see segment 9, since the magnetic field (if the spoiler gradient pulse 2, 3 alone is considered) remains the same. Due to the high time constant the profile in segment 9 appears almost linear, but proceeds exponentially.

The descending slope of the spoiler gradient pulse 2, 3 starts at time point 10, so that a reverse eddy current is induced here as can be seen in the profile in segment 11. At time point 12 (end of the gradient pulse 2, 3) a residual eddy current with a certain strength 13 is therefore present, which then starts to decay with the long time constant, see segment 14.

The eddy currents are generated in conductive structures of components of the magnetic resonance facility. The properties of these components with reference to eddy currents, so that what eddy currents are triggered by what gradient pulse of a magnetic resonance sequence can be calculated or simulated respectively, can be measured in a calibration operation in the form of component information, for which for example special sensors, magnetic resonance-based methods known from the prior art, or similar can be employed. These effects are not noticeably dependent on the patient so that a once-only calibration measurement or one repeated at lengthy time intervals is adequate for determining component information with reference to eddy currents.

Figure 3:
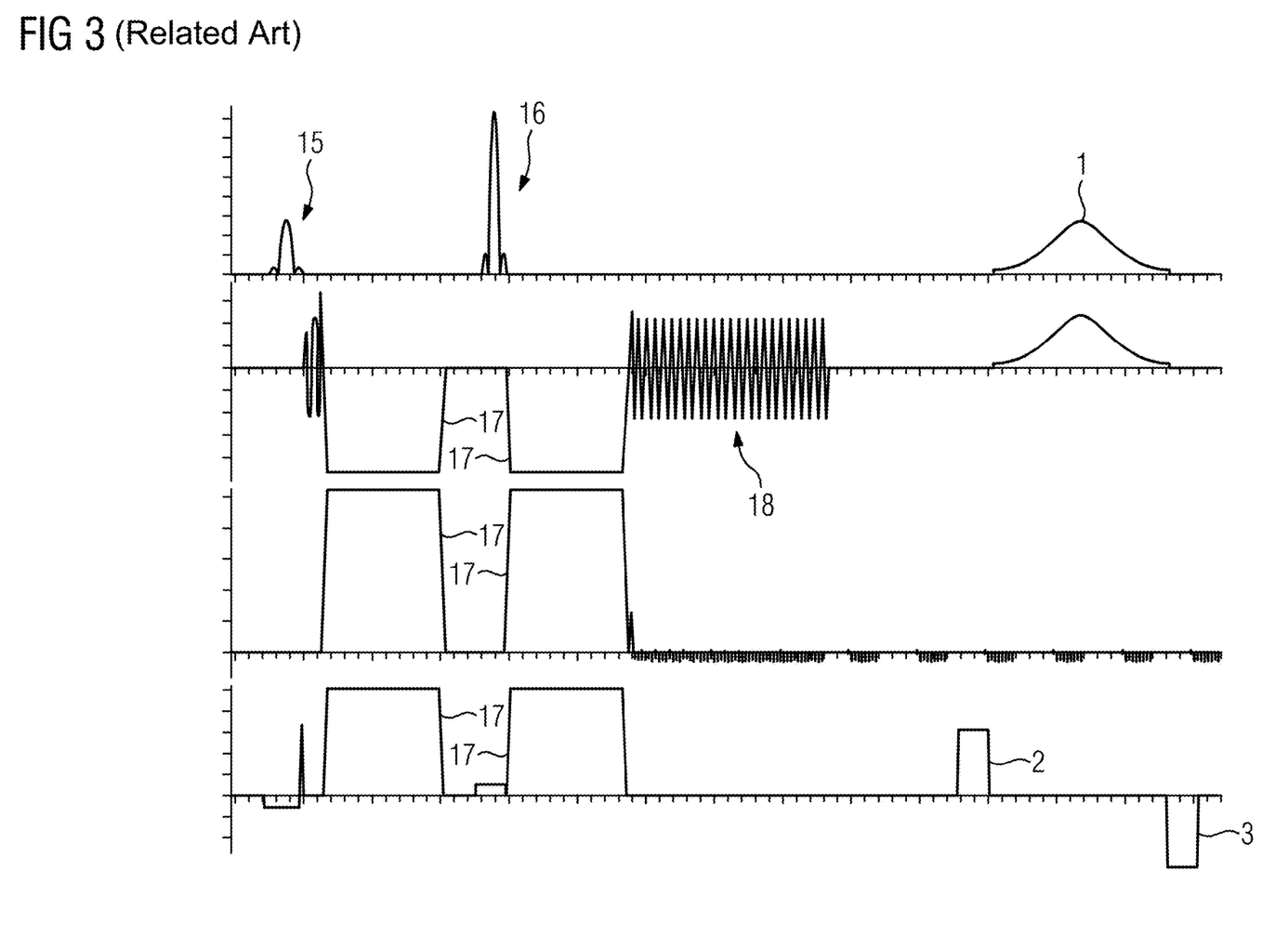
FIG. 3 illustrates a part of an example diffusion Echo Planar Imaging (EPI) sequence.

FIG. 3 shows part of a sequence diagram for a conventional diffusion EPI sequence. It shows the saturation module initially emitted at the start of each repetition (here in the sense of a fresh excitation pulse and not referring to a renewed recording of the same slice) together with the saturation pulse 1 and the spoiler gradient pulses 2, 3 following on from the preceding repetition. This manifestly contains a plurality of further gradient pulses which are assigned in time to corresponding high-frequency pulses 15, 16. In this regard, in a diffusion EPI sequence, it is particularly the diffusion gradient pulses 17, and also with less relevance the "blips" 18 in the readout train that frequently cause rapid changes in the gradient fields, which are responsible for generating eddy currents and therefore eddy current fields, although other gradient pulses can also be relevant—in particular also spoiler gradient pulses of previous saturation modules. Investigations have shown that the diffusion gradient pulses 17 must be considered the main relevant causes of eddy currents with longer-lasting time constants. As can be seen from FIG. 3, the spoiler gradient pulses 2, 3 are on the one hand only emitted on one gradient axis, here for example with the Z gradient coil assigned to the Z direction. For this diffusion direction the first spoiler gradient pulse 2 has the same polarity as the diffusion gradient pulses 17, which rather results in a strengthening of eddy currents with long time constant that are present due to the diffusion gradient pulse 17.

Figure 4:
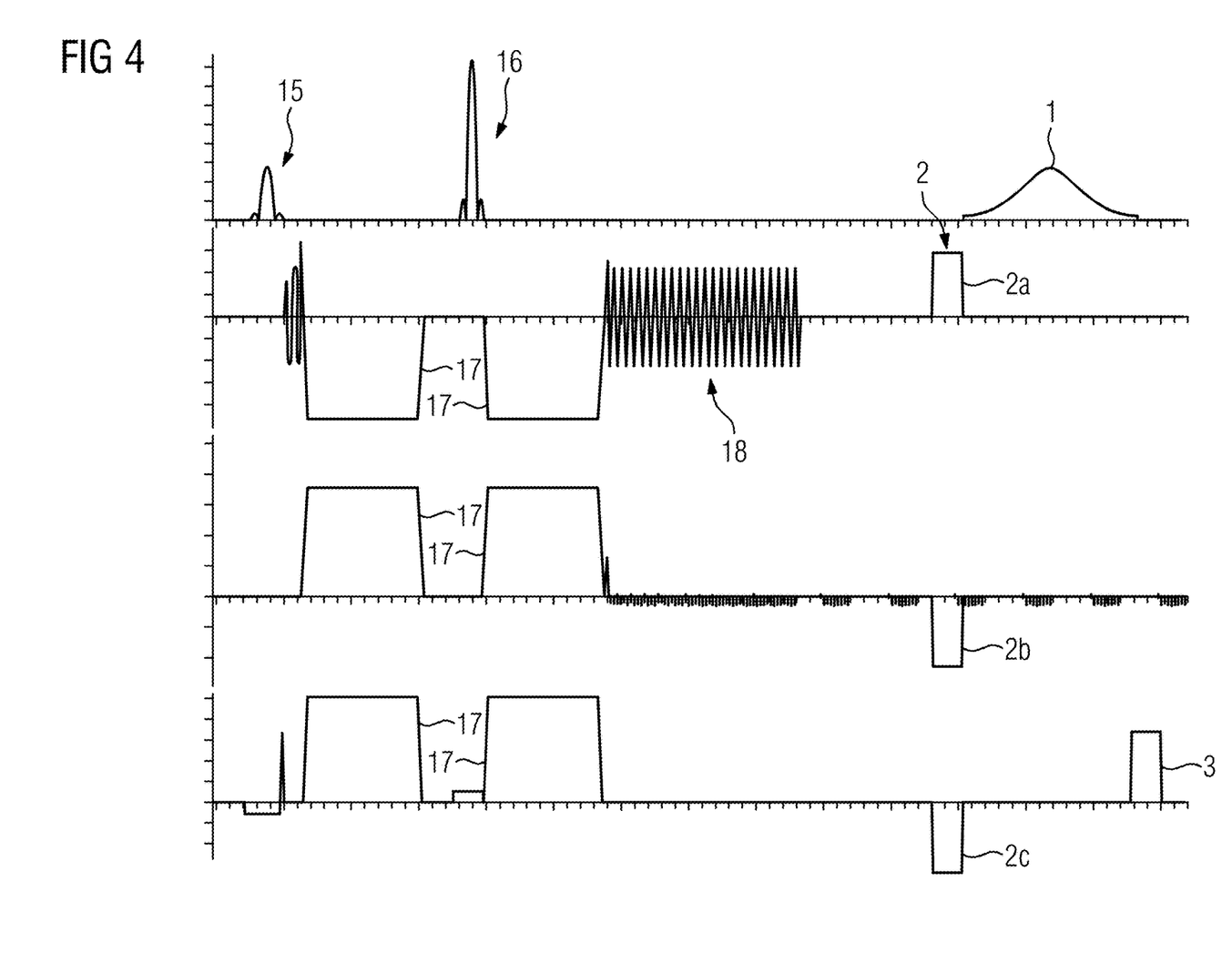
FIG. 4 illustrates a diffusion EPI sequence according to an exemplary embodiment of the present disclosure.

In an exemplary embodiment, pulse parameters of the first spoiler gradient pulse 2 are selected such that the strength of eddy currents at the time point when the saturation pulse 1 is emitted is reduced as distinctly as possible, so the outcome is not false excitations or even excitations that are not present at all due to field inhomogeneities. In this regard FIG. 4 shows a sequence diagram according to an exemplary embodiment. The sequence diagram of FIG. 4 can represent a medication of the sequence diagram corresponding to the one in FIG. 3. In an exemplary embodiment, the end of the preceding repetition with pulses 15 to 18 remains unchanged. For the first spoiler gradient pulse 1 however, the gradient axes—here all three—to be used, the polarities, and the amplitudes or their distribution to the gradient axes have then been selected such that the eddy currents at the time point when the saturation pulse 1 is emitted are distinctly reduced. The spoiler gradient pulse 1 therefore then contains three part pulses 2a, 2b, and 2c for the various gradient axes, in regard to which it can be seen that their polarity corresponds in each case to the reverse polarity of the diffusion gradient pulses 17 for the respective axes. Furthermore there is also a corresponding adjustment and distribution of the amplitudes present, to achieve the qualitatively distinct reduction in the eddy currents through compensation by using the modified first spoiler gradient pulse 2.

In this regard it should be noted at this point that the estimation of eddy current data, which describes the eddy currents generated by the further gradient pulses 17, 18 at the time of the saturation module, and also the determination of adjusted pulse parameters for the first spoiler gradient pulse 2 based on the known component information, and the sequence data that is also known in advance, which describes the gradient pulses to be emitted, is already possible in advance, which incidentally also makes it possible, in the case of a greatly changed moment of the spoiler gradient pulse 2 due to adjustment of the pulse parameters, to correspondingly adjust the dephasing moment of the preceding second spoiler gradient pulse 3 so that a corresponding rephasing is produced.

Figure 5:
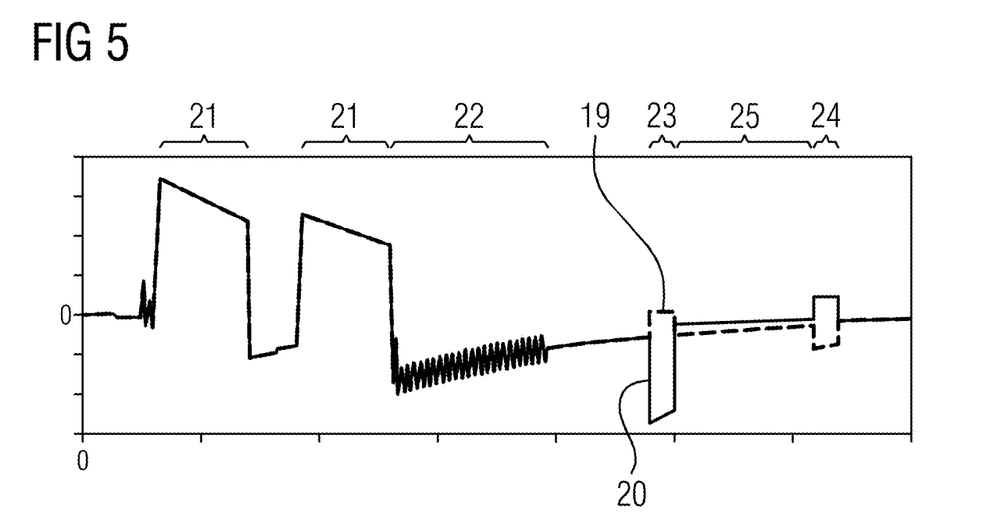
FIG. 5 illustrates a profile of eddy currents, according to an exemplary embodiment of the present disclosure, for the sequence diagram as shown in FIG. 4 with a comparison to the profile for the sequence diagram as shown in FIG. 3.

FIG. 5 shows, in qualitative terms in each case, the eddy current profile for the sequence diagrams in FIGS. 3 and 4. In this regard the broken curve 19 shows the profile for a non-adjusted first spoiler gradient pulse 2 according to FIG. 3. Overlaid on this is shown the solid curve 20, which is given by the selection of pulse parameters undertaken according to FIG. 4. The time intervals 21 of the diffusion gradient pulses 17, and also the time interval 22 of the "blips" 18, can be clearly seen. It can also be seen that the first spoiler gradient pulse 2 and the second spoiler gradient pulse 3 respectively are emitted in the time intervals 23 and 24. The relevant time interval 25 in which the saturation pulse 1 is emitted lies between the time intervals 23 and 24. It is evident from curves 19 and 20 that the eddy currents are reduced by more than half with adjustment of the pulse parameters in time interval 25, without the eddy currents outside the saturation module being significantly strengthened.

Figure 6:
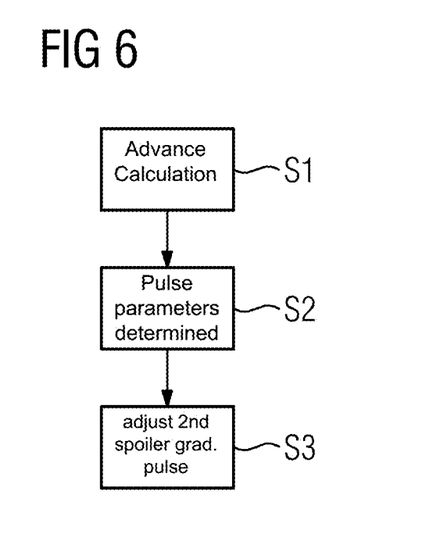
FIG. 6 illustrates a flowchart of a method according to an exemplary embodiment of the present disclosure.

FIG. 6 then shows a flowchart for the inventive method according to an exemplary embodiment. In Step S1 in this regard an advance calculation is performed for each saturation module to be emitted, in particular already prior to the start of the investigation using the diffusion EPI sequence, of what eddy currents are present at the time point when the saturation pulse 1 is emitted. In this regard it is possible to work via a mathematical relation and/or a simulation starting from the sequence data and the component information already mentioned.

In Step S2 the eddy current data and once again the component information are used to determine the pulse parameters for the first spoiler gradient pulse 2 of each saturation module. Since this involves a qualitative reduction, it can be done on the basis of a simplified relation once again, but also in a somewhat more complex optimization method. In any case however, boundary conditions are considered in Step S2. Firstly limitations must be mentioned in this regard. On the one hand, due to the gradient system of the gradient coil arrangement, certain restrictions are present with reference to the maximum amplitude, the maximum slew rate, and a power restriction, which are taken into account. Furthermore the spoiler gradient pulse 3 is intended to dephase the fat spins, so that a minimum overall moment can be specified.

Due to the modification of pulse parameters, where incidentally in the present case the amplitude, the polarity, and the gradient axes used, in particular also the distribution of the amplitudes to the gradient axes, are used, there is still a possibility for each saturation module that the first spoiler gradient pulse 2 no longer rephases the dephasing second spoiler gradient pulse of the previous saturation module in the necessary manner. While this does not significantly affect image quality in many situations, cases can nevertheless exist where the most complete rephasing possible is introduced as an additional boundary condition.

It should be pointed out in this regard that, alternatively or additionally, it is also conceivable however, since the calculation is of course effected prior to the actual investigation, to adjust the second spoiler gradient pulse of the preceding saturation module correspondingly to the adjusted moment of the first spoiler gradient pulse 2 of the following saturation module, see optional Step S3, as long as the minimum overall moment for dephasing is maintained.

Figure 7:
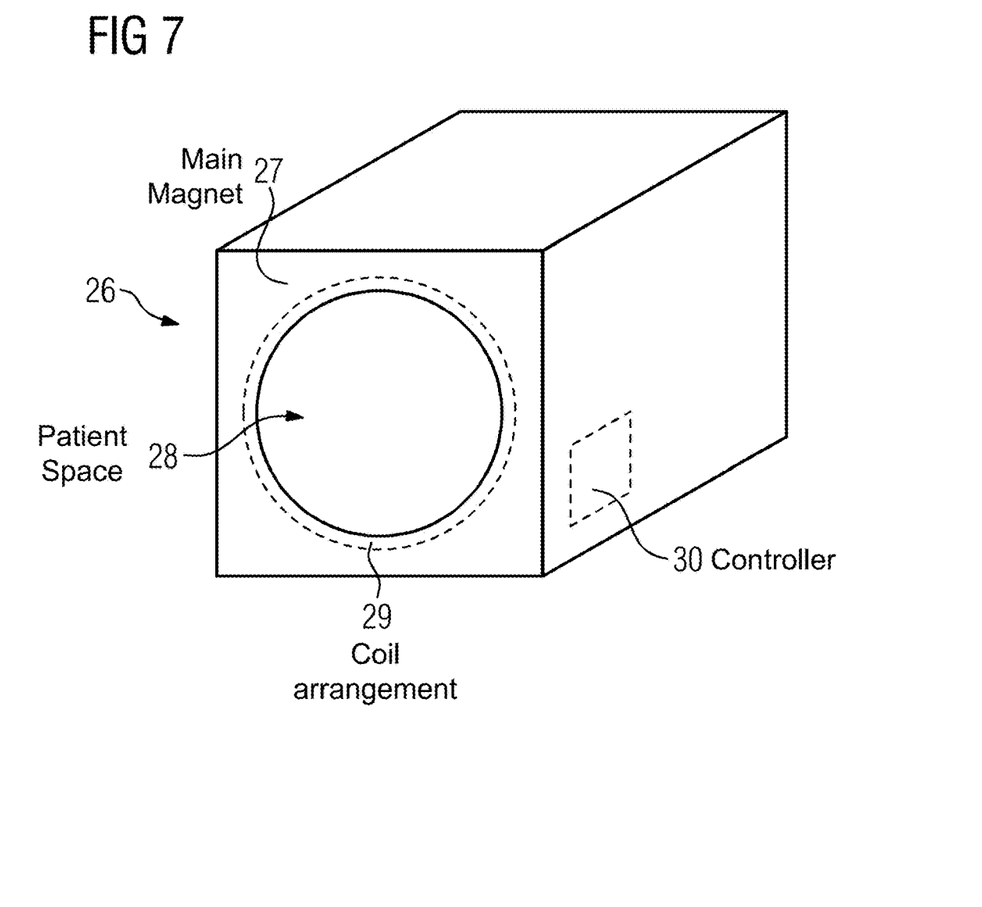
FIG. 7 illustrates a schematic diagram of a magnetic resonance facility according to an exemplary embodiment of the present disclosure.

FIG. 7 shows a schematic diagram of a magnetic resonance (MR) facility (i.e. MR scanner) 26 according to an exemplary embodiment. In an exemplary embodiment, the MR facility 26 includes a main magnet unit 27 that defines a space for positioning the patient 28 into which a patient is introduced by using a patient bed that is not shown in detail here. A high-frequency coil arrangement, which is not shown in detail here, and a gradient coil arrangement 29, are provided surrounding the patient space 28.

In an exemplary embodiment, the gradient coil arrangement 29 has three gradient coils, each one assigned to a gradient axis, in this case an X gradient coil, a Y gradient coil, and a Z gradient coil. The gradient coils therefore generate a gradient field which has a gradient along the respective gradient axis. The gradient axes X, Y, Z are frequently also referred to as main directions.

In an exemplary embodiment, the operation of the magnetic resonance facility 26 is controlled by a controller 30 which is configured to perform the inventive method according to one or more exemplary aspects. In an exemplary embodiment, the controller 30 includes processor circuitry that is configured to perform one or more functions/operations of the controller 30, including controlling the magnetic resonance facility 26 and performing one or more operations of the methods according to exemplary embodiments described herein.

In an exemplary embodiment, a terminal (not shown) can be communicatively coupled to the magnetic resonance facility 26. The terminal can include a display, a keyboard and a mouse for a graphical user interface. The terminal serves as user interface by which a user operates the controller and thereby the magnetic resonance facility 26. In an exemplary aspect, the terminal may be an integral component of the magnetic resonance facility 26. In an exemplary embodiment, the terminal includes processor circuitry that is configured to perform one or more functions/operations of the terminal. In an exemplary embodiment, the terminal is a computer that is configured to execute one or more internally and/or externally stored applications to perform the functions/operations of the terminal.

Figure 8:
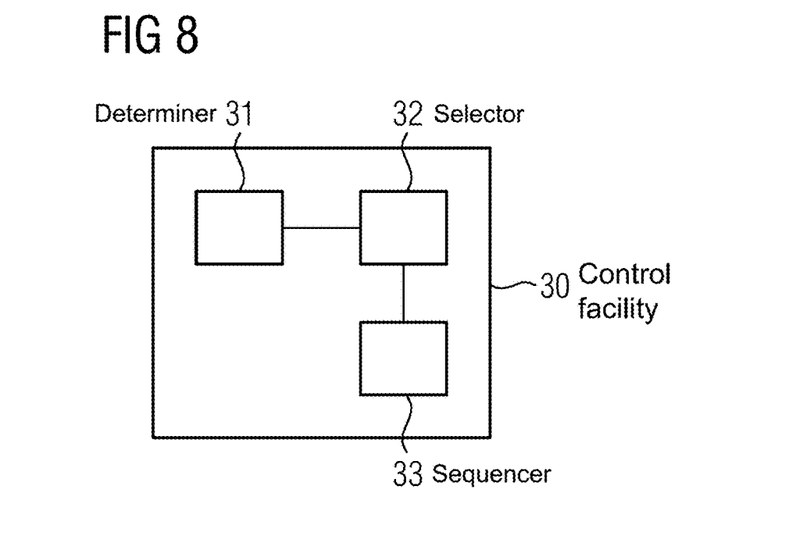
FIG. 8 illustrates a control facility of the magnetic resonance facility according to an exemplary embodiment of the present disclosure.

In an exemplary embodiment, as shown in FIG. 8, the control facility 30 includes at least one determiner 31 configured to determine the eddy current data, a selector 32 configured to select the pulse parameters, and a sequencer 33 configured to control the process of the magnetic resonance sequence, and therefore in the present case, ensures emission of the first spoiler gradient pulses 2 with the correspondingly selected pulse parameters. In an exemplary embodiment, the determiner 31, selector 32, and sequencer 33 are embodied in one or more processors of the controller 30.

Although the disclosure has been illustrated and described closely and in detail by the preferred exemplary embodiment, the disclosure is not limited by the examples disclosed and other variations can be derived from this by a person skilled in the art without departing from the scope of protection of the disclosure.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computers, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, programmable processing circuit, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for operating a magnetic resonance (MR) scanner during recording of magnetic resonance data by using a magnetic resonance sequence, which includes at least one saturation module for a spin type to be saturated, in which a high-frequency saturation pulse is emitted between a first and a second spoiler gradient pulse, and multiple further gradient pulses apart from the spoiler gradient pulses, the method comprising:
   determining eddy current data corresponding to eddy currents which exist during emission of the saturation pulse and resulting from the further gradient pulses;
   selecting at least one pulse parameter of the first spoiler gradient pulse based on the eddy current data such that the eddy currents generated by way of the first spoiler gradient pulse compensate for at least part of the eddy currents identified in the eddy current data at least during emission of the saturation pulse; and
   controlling the MR scanner to emit the first spoiler gradient pulse with the at least one selected pulse parameter.

2. The method as claimed in claim 1, wherein the pulse parameter includes pulse parameters determining a pulse shape, a polarity, or gradient directions used.

3. The method as claimed in claim 1, wherein:
   the further gradient pulses comprise at least one diffusion gradient pulse in a diffusion module of the magnetic resonance sequence.

4. The method as claimed in claim 3, wherein, as a pulse parameter, a polarity of the first spoiler gradient pulse of the saturation module following the diffusion module is selected opposite to that of the at least one diffusion gradient pulse.

5. The method as claimed in claim 1, wherein the eddy current data is determined:
   based on a simulation using sequence data;
   using a mathematical relation of the sequence data; and/or
   based on the sequence data describing the further gradient pulses.

6. The method as claimed in claim 1, wherein the eddy current data is determined based on at least one item of component information describing at least one property of at least one component of the MR scanner with reference to eddy currents induced by gradient pulses.

7. The method as claimed in claim 6, wherein the at least one item of component information is determined in a calibration operation by measuring with predefined calibration gradient pulses.

8. The method as claimed in claim 6, wherein the at least one item of component information comprises: at least one strength variable describing a strength of the induced eddy currents, and/or at least one time constant describing a decay of the eddy currents.

9. The method as claimed in claim 1, wherein the at least one pulse parameter is selected such that residual eddy currents are minimized.

10. The method as claimed in claim 1, wherein the at least one pulse parameter is selected based on at least one boundary condition.

11. The method as claimed in claim 10, wherein the at least one boundary condition comprises:
   at least one minimum overall moment of the first spoiler gradient pulse;
   a maximum amplitude of the first spoiler gradient pulse; and/or
   a maximum slew rate of the first spoiler gradient pulse.

12. The method as claimed in claim 10, wherein the at least one boundary condition comprises a maximum rephasing of spins of the spin type to be saturated, that are dephased by the second spoiler gradient pulse of a preceding saturation module.

13. The method as claimed in claim 1, further comprising adjusting, as a function of the pulse parameter selected for the first spoiler gradient pulse, at least one pulse parameter of the second spoiler gradient pulse of a preceding saturation module.

14. The method as claimed in claim 13, wherein, in the event of a rephasing moment diverging from a specified moment due to the selected pulse parameter of the first spoiler gradient pulse, the pulse parameter of the second spoiler gradient pulse of the preceding saturation module is adjusted to generate a dephasing moment corresponding to the rephasing moment.

15. The method as claimed in claim 1, wherein the magnetic resonance sequence is an Echo Planar Imaging (EPI) sequence.

16. A magnetic resonance (MR) system, comprising:
   a MR scanner; and
   a controller communicatively coupled to the MR scanner, and configured to perform the method as claimed in claim 1.

17. A computer program product having a computer program which is directly loadable into a memory of a controller of a magnetic resonance system, when executed by the controller, causes the magnetic resonance system to perform the method as claimed in claim 1.

18. A non-transitory computer-readable storage medium with an executable program stored thereon, that when executed, instructs a processor to perform the method of claim 1.

19. The method as claimed in claim 1, wherein the first spoiler gradient is configured to rephase spins of the spin type to be saturated at a start of the saturation pulse.

20. The method as claimed in claim 1, further comprising adjusting the second spoiler gradient pulse of a preceding saturation module based on the first spoiler gradient pulse.

* * * * *